(12) United States Patent
Yeh et al.

(10) Patent No.: US 7,929,294 B2
(45) Date of Patent: Apr. 19, 2011

(54) HYBRID COOLING SYSTEM FOR OUTDOOR ELECTRONICS ENCLOSURE

(75) Inventors: Joseph Yeh, Plano, TX (US); Walter Hendrix, Richardson, TX (US)

(73) Assignee: CommScope Inc. of North Carolina, Hickory, NC (US)

( * ) Notice: Subject to any disclaimer, the term of this patent is extended or adjusted under 35 U.S.C. 154(b) by 34 days.

(21) Appl. No.: 12/411,264

(22) Filed: Mar. 25, 2009

(65) Prior Publication Data
US 2010/0059270 A1  Mar. 11, 2010

Related U.S. Application Data

(60) Provisional application No. 61/096,239, filed on Sep. 11, 2008.

(51) Int. Cl.
*H05K 7/20* (2006.01)

(52) U.S. Cl. ........... 361/679.5; 361/679.46; 361/679.47; 361/690; 361/689; 361/696; 165/47; 165/104.33; 165/263; 62/3.2; 62/259.2

(58) Field of Classification Search ............. 361/679.46, 361/679.47, 679.5, 688, 689, 690–697; 165/47, 165/263, 103, 104.32, 104.33, 122, 80.2, 165/185, 260, 261, 288, 291; 62/3.2, 259.2, 62/255, 440, 441, 452; 454/184; 312/223.2, 312/223.3, 236
See application file for complete search history.

(56) References Cited

U.S. PATENT DOCUMENTS

| | | | |
|---|---|---|---|
| 4,129,014 A | | 12/1978 | Chubb |
| 4,449,579 A | * | 5/1984 | Miyazaki et al. ........ 165/104.33 |
| 4,827,735 A | | 5/1989 | Foley |
| 5,036,904 A | | 8/1991 | Kanda |
| 5,040,095 A | * | 8/1991 | Beaty et al. .................... 361/694 |
| 5,255,526 A | | 10/1993 | Fischer |
| 5,467,250 A | * | 11/1995 | Howard et al. ............... 361/696 |
| 5,608,609 A | * | 3/1997 | Morrell ......................... 361/690 |
| 5,646,825 A | * | 7/1997 | Huttenlocher et al. ........ 361/699 |
| 5,655,381 A | * | 8/1997 | Huttenlocher et al. ....... 62/259.2 |
| 5,806,948 A | * | 9/1998 | Rowan et al. ............... 312/293.3 |
| 5,812,373 A | * | 9/1998 | Hwang ......................... 361/704 |
| 5,813,243 A | * | 9/1998 | Johnson et al. .............. 62/259.2 |
| 5,832,988 A | * | 11/1998 | Mistry et al. ................... 165/103 |
| 5,934,079 A | * | 8/1999 | Han et al. ........................ 62/3.2 |
| 6,079,481 A | | 6/2000 | Lowenstein |
| 6,088,225 A | * | 7/2000 | Parry et al. .................... 361/704 |
| 6,119,768 A | * | 9/2000 | Dreier et al. ............. 165/104.33 |
| 6,164,369 A | * | 12/2000 | Stoller ..................... 165/104.33 |
| 6,294,721 B1 | * | 9/2001 | Oravetz et al. ................ 136/242 |
| 6,400,567 B1 | * | 6/2002 | McKeen et al. ............... 361/695 |
| 6,533,031 B1 | * | 3/2003 | Garcia et al. .................. 165/263 |
| 6,598,668 B1 | * | 7/2003 | Cosley et al. ............ 165/104.32 |

(Continued)

FOREIGN PATENT DOCUMENTS

JP  09-083167 A  3/1997

(Continued)

*Primary Examiner* — Michael V Datskovskiy
(74) *Attorney, Agent, or Firm* — Muncy, Geissler, Olds & Lowe, PLLC

(57) ABSTRACT

A cooling system for an outdoor electronic enclosure, with separate compartments for electronics and batteries, includes separate cooling devices for each compartment so that optimal temperatures are provided to each compartment. The batteries are cooled by a thermo-electric type air-conditioner, while the electronics are cooled by direct air cooling device or a heat exchanger.

18 Claims, 4 Drawing Sheets

U.S. PATENT DOCUMENTS

| | | | |
|---|---|---|---|
| 6,651,446 B1 * | 11/2003 | Woods | 62/3.7 |
| 6,704,198 B2 * | 3/2004 | Replogle et al. | 361/690 |
| 6,732,787 B1 * | 5/2004 | Trehan et al. | 165/104.33 |
| 6,742,583 B2 * | 6/2004 | Tikka | 165/291 |
| 6,834,715 B2 * | 12/2004 | Garcia et al. | 165/263 |
| 6,877,551 B2 * | 4/2005 | Stoller | 165/47 |
| 6,889,752 B2 * | 5/2005 | Stoller | 165/47 |
| 7,312,993 B2 * | 12/2007 | Bundza et al. | 361/696 |
| 7,436,660 B2 * | 10/2008 | Pedoeem et al. | 361/690 |
| 2008/0068798 A1 * | 3/2008 | Hendrix et al. | 361/696 |
| 2008/0104965 A1 * | 5/2008 | Petratos | 62/3.6 |

FOREIGN PATENT DOCUMENTS

| | | |
|---|---|---|
| KR | 10-2004-0001731 A | 1/2004 |
| KR | 10-2007-0105152 A | 10/2007 |

* cited by examiner ial Patent application No. 61/096,239, filed Sep. 11, 2008,

HYBRID COOLING SYSTEM FOR OUTDOOR ELECTRONICS ENCLOSURE

CROSS REFERENCE TO RELATED APPLICATION

The present invention claims the benefit of U.S. Provisional Patent application No. 61/096,239, filed Sep. 11, 2008, the entire contents of which is hereby incorporated by reference.

FIELD OF THE INVENTION

The present invention is directed toward a hybrid cooling system for an outdoor electronics enclosure and more specifically, toward a hybrid cooling system using separate cooling devices for different compartments within an outdoor electronics enclosure.

BACKGROUND OF THE INVENTION

Outdoor enclosures for electronic systems and telecommunications systems are known. Some enclosures also include batteries, such as valve-regulated lead acid (VRLA) batteries as a backup power supply for the electronics. It is important to regulate the temperature of the inside of the enclosure to specified levels. This is necessary in order to ensure the proper operation of the electronics and also the batteries.

If the equipment within the enclosure produces a large amount of heat, the only method of cooling that is adequate for the task is direct air cooling. For other equipment which is less demanding, a heat exchanger may be sufficient. Active electronic or telecommunications equipment will operate properly at temperatures up to 50, 55 or even 65° C. However, if batteries are present within the same enclosure, the batteries rapidly lose the ability to retain a charge if the temperatures exceed 30° C. for an extended period of time. Thus, some form of air-conditioning is necessary to maintain the temperatures of the batteries near 25° C.

Many outdoor enclosures must use air conditioning to keep the batteries at a proper temperature. However, in such outdoor enclosures, the air conditioner also acts to cool the electronics. The electronics are cooled to a greater degree than is required by the electronics itself. The over cooling of the electronics can lead to flash condensation on the electronics when the door is opened and humid ambient air enters the enclosure. Thus, the use of air-conditioning may properly cool the batteries, but overcool the electronics. On the other hand, direct air cooling or a heat exchanger may allow the battery temperature to be too high, especially in the higher ambient temperature areas, or may allow the battery temperature to be too low in lower ambient temperature areas. Thus, none of these arrangements can provide for optimal temperature control suitable to both the batteries and electronics.

SUMMARY OF THE INVENTION

One or more of these problems and others are addressed by the present invention where separate compartments are provided for the electronics and batteries, with separate cooling devices for each compartment. An air conditioner is provided for the battery compartment while direct air cooling or a heat exchanger is provided for the electronics compartment.

Another aspect of the invention includes an electronics enclosure having an outer housing and a door. A divider in the housing separates the interior space into at least two compartments, each housing one of the batteries and electronics. The door incorporates the cooling devices for each compartment. This hybrid cooling system provides for different types of cooling in the different compartments.

This type of hybrid cooling system optimizes the temperature for the electronics and batteries, and extends battery life. Power consumption by the hybrid cooling system and the cost of utilities associated therewith are also minimized. The cost of manufacturing the hybrid cooling system is also reduced. The frequency of maintenance associated with the hybrid cooling system can also be reduced.

BRIEF DESCRIPTION OF THE DRAWINGS

These and other aspects and features of embodiments of the present invention will be better understood after reading of the following detailed description, together with the attached drawings, wherein.

DETAILED DESCRIPTION

Figure 1:
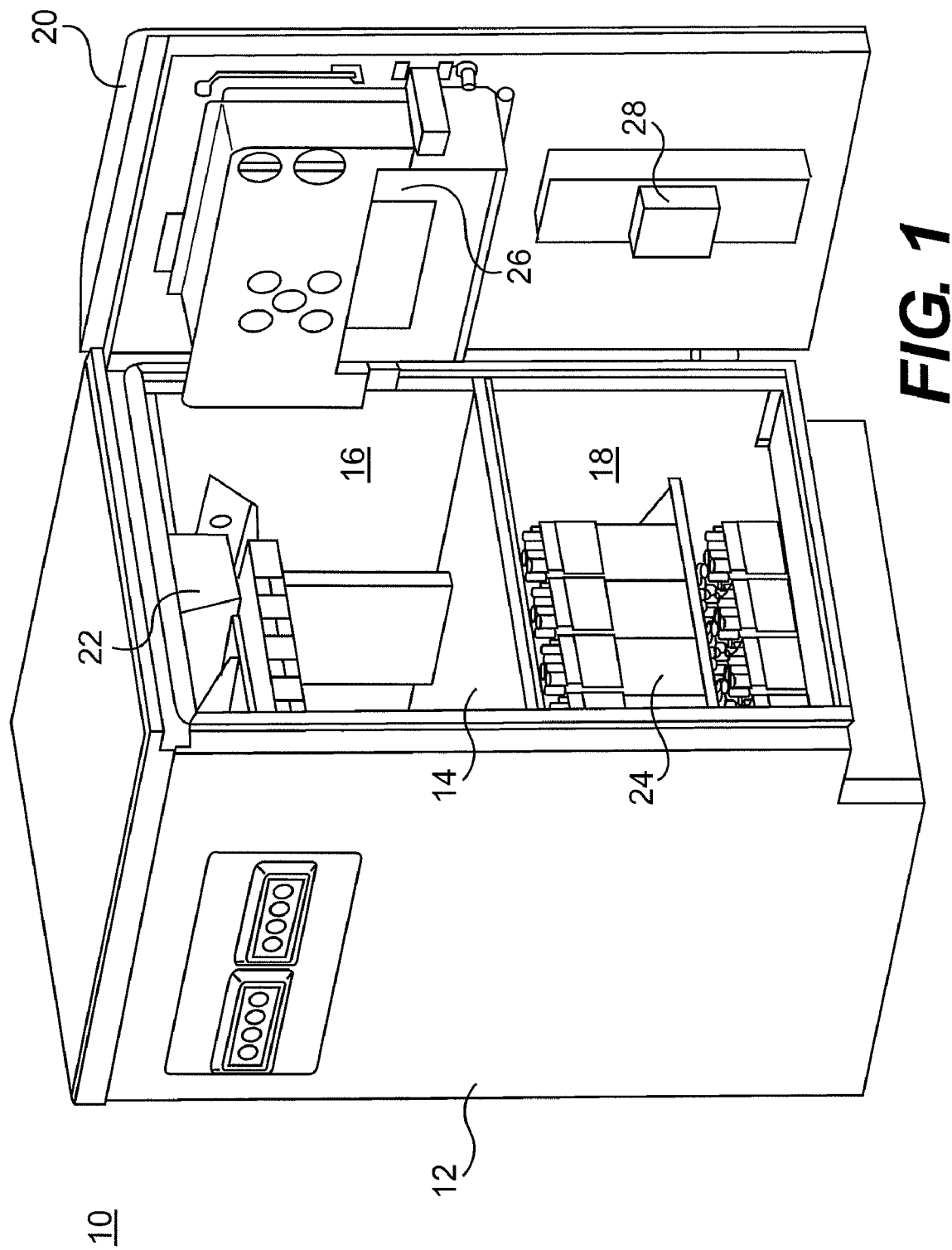
FIG. 1 is a perspective view of a first embodiment of an outdoor enclosure according to the present invention.

The present invention now is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity.

The terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "lateral", "left", "right" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. The device may be otherwise oriented (rotated 90 degrees or at other orientations) and the descriptors of relative spatial relationships used herein interpreted accordingly.

Referring now to the drawings, FIG. 1 illustrates an enclosure 10, having a housing 12, a divider 14, an electronics compartment 16, a battery compartment 18 and a door 20. Electronics compartment 16 houses active electronics 22, while battery compartment 18 houses batteries 24. Door 20 includes two separate cooling devices 26, 28, with one arranged for each compartment 16, 18. Thus, a direct air cooling device 26 is arranged in the upper portion of the door 20 and interacts with the electronics compartment 16. A thermo-electric type air-conditioner 28 is arranged in the lower portion of the door 20 and interacts with the battery compartment 18.

Figure 2:
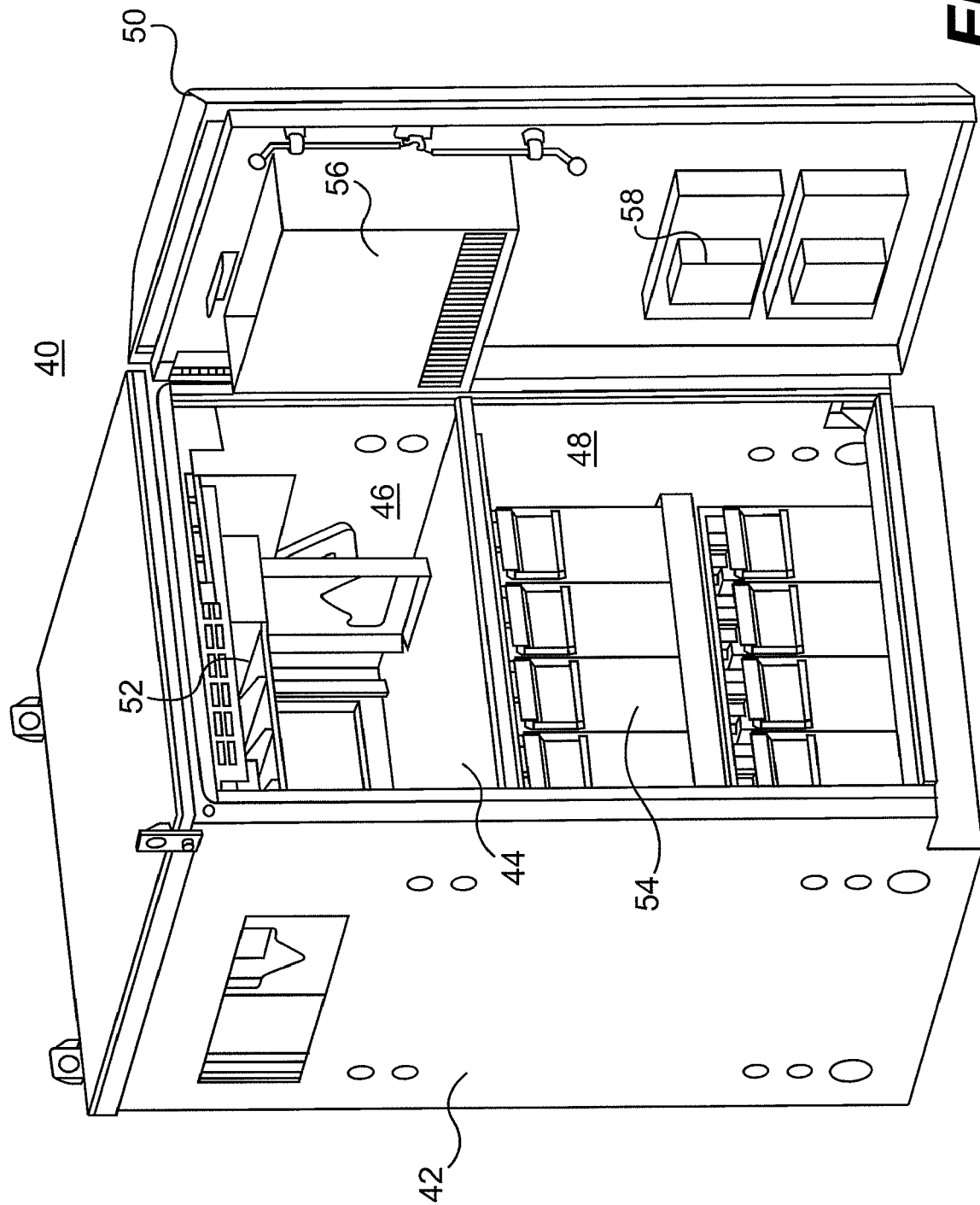
FIG. 2 is a perspective view of a second embodiment of an outdoor enclosure according to the present invention.

Similarly, FIG. 2 shows a second embodiment with an enclosure 40, having a housing 42, a divider 44, an electronics compartment 46, a battery compartment 48 and a door 50. Electronics compartment 46 houses active electronics 52, while the battery compartment 48 houses batteries 54. Door 50 includes two separate cooling devices 56, 58, one arranged for each compartment 46, 48. Thus, a heat exchanger 56 is arranged in the upper portion of the door 50 and interacts with the electronics compartment 46. A thermo-electric type air-conditioner 58 is arranged in the lower portion of the door 50 and interacts with the battery compartment 48.

In each of these embodiments, the lower compartment 48 having the batteries 24, 54 is cooled by a thermo-electric type air-conditioner 28, 58. This type of air-conditioner is preferred since it has fewer moving parts than the more common gas cycle air-conditioner, resulting in lower maintenance costs and less frequent maintenance visits. However, other types of air-conditioners could be used as well.

In the first embodiment, the direct air cooling device 26 is provided. As indicated above, in many instances, this direct air cooling device 26 provides for maximum cooling when it is required. In the second embodiment, a heat exchanger 56 is utilized, which may provide adequate cooling for the electronics 22 in arrangements where the electronics 22 do not produce as much heat.

Figure 3:
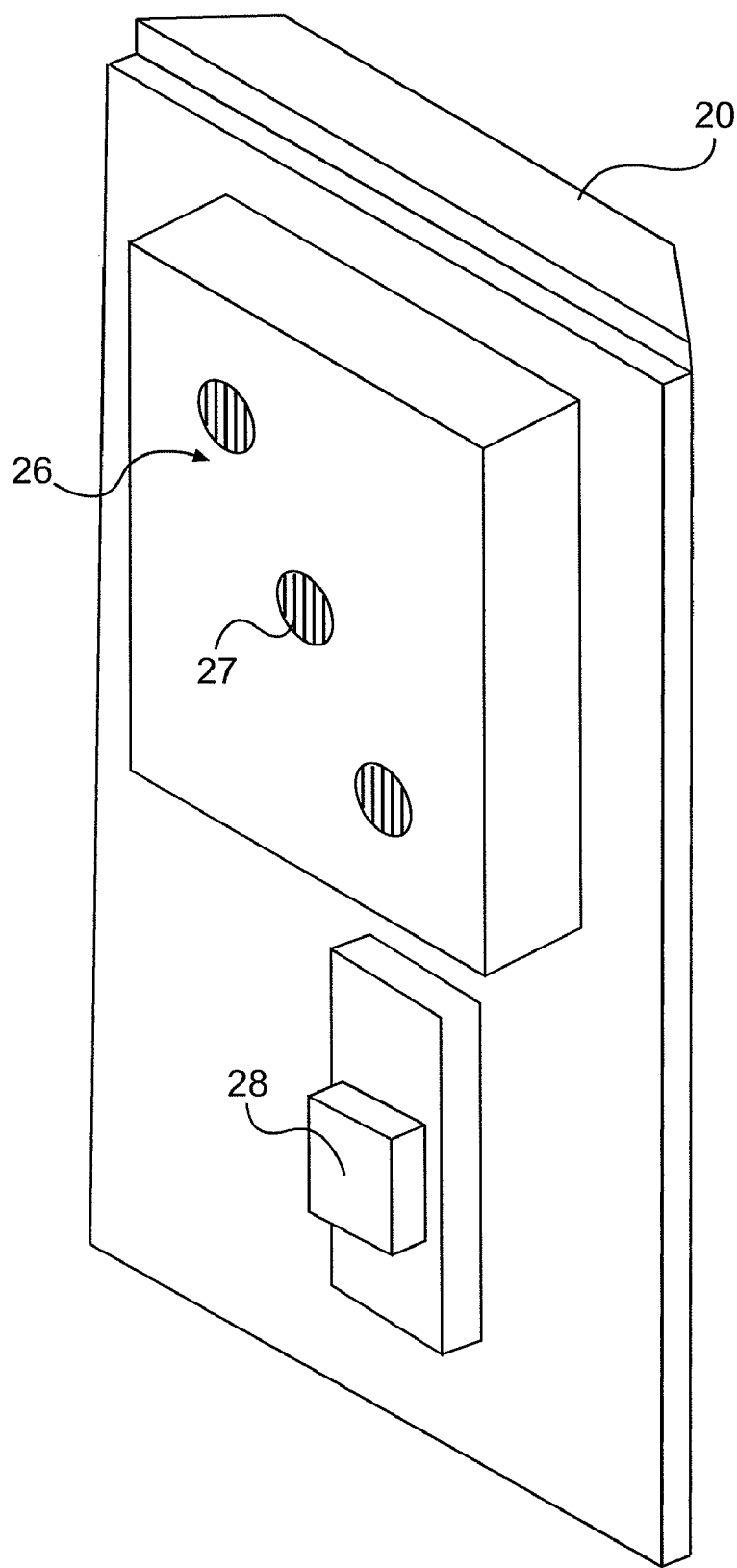
FIG. 3 is a perspective view of a door used in the embodiment of FIG. 1.

FIG. 3 shows the assembly of the door 20 in the embodiment of FIG. 1. The door 20 includes a thermoelectric type air-conditioner 28 in the lower portion of the door 20. A direct air cooling device 26 is arranged in the upper portion of the door 20. Three fans 27 are shown in the direct air cooling device 26. However, any number of fans 27 can be used, depending on the thermal requirements of the electronics 22. Although not shown, filter devices can also be used to prevent the inclusion of dust and other unwanted material into the enclosure 10.

Figure 4:
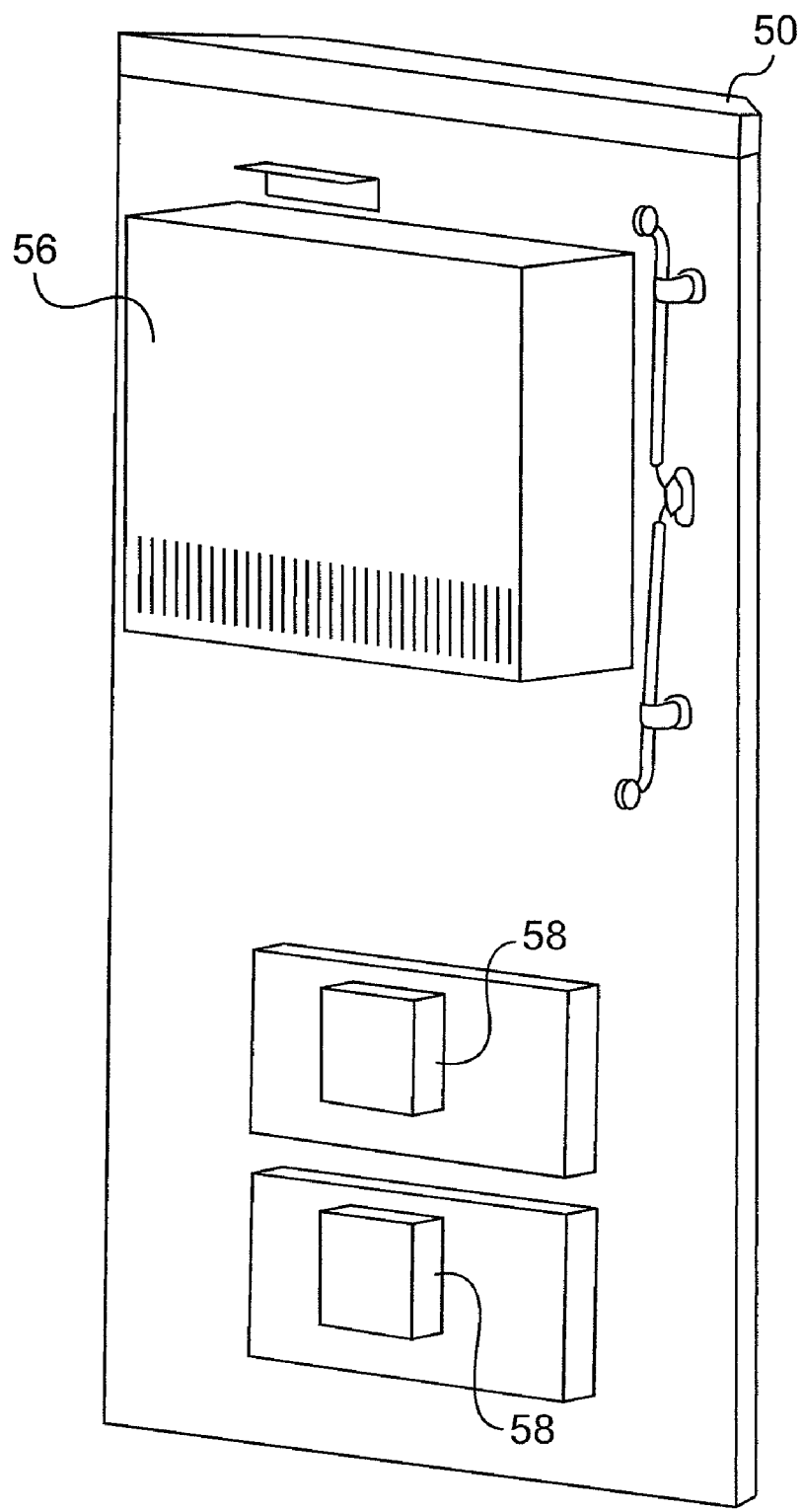
FIG. 4 is a perspective view of a door used in the embodiment of FIG. 2.

FIG. 4 similarly shows the assembly of the door 50 in the embodiment of FIG. 2. The door 50 includes a thermoelectric type air-conditioner 58 in the lower portion of the door 50. A heat exchanger 56 is arranged in the upper portion of the door 50. In this arrangement, the thermo-electric type air-conditioner 58 actually includes two thermo-electric cooling devices. The number of thermoelectric cooling devices in the thermo-electric type air-conditioner 58 will depend on the thermal requirements of the batteries 54.

Although the figures show the cooling devices mounted in the door, it would also be possible to mount them in the wall of each compartment instead. By mounting the cooling devices in the door, it is possible to use a standardized enclosure with different door arrangements for different cooling requirements. To the extent that the cooling devices are similarly sized, the doors can be also standardized with an opening appropriate for any of the cooling systems.

By having separate cooling devices for each of the compartments, it is possible to optimize the temperature in each compartment and decrease the power requirements of the system. Thus, the use of air conditioning is limited to the battery compartment which requires it. The air-conditioner is only active when it is necessary to cool the batteries. This differs from the prior art where the air-conditioner was run continuously since no other means of transferring heat was available. Thus, considerable cost savings are available due to the lower power consumption.

Calculations can be made as to the cost of operating a traditional air-conditioner in comparison to a combination of fans and thermoelectric devices. Traditional air-conditioners in the range of 8,000-10,000 BTUs have an annual operational cost in the range of $1,300-$2,300. This may be compared to the cost of a combination of fans and thermoelectric devices which have an annual operational cost of $500-$1,100. Thus, considerable operational costs are avoided.

In addition, the initial equipment costs are also reduced. An 8,000 BTU air conditioner may cost approximately $2,200. However, a heat exchanger and two small thermoelectric air-conditioners would only cost approximately $1,600, for savings of about $600. In a direct air cooled system with two small thermoelectric air-conditioners, the additional cost may be only $1,400, resulting in an $800 savings. If only one thermoelectric air-conditioner would be needed in the case of a small battery enclosure, the savings would be roughly $1,200.

It would also be possible to use DC power components rather than traditional AC components. This allows the cooling system to still work if AC power is lost. Thus, the cooling system may continue to run under battery power when AC power is lost so that overheating of the system will not occur as quickly. As a result, the enclosure will be functional for a longer period of time than the standard AC power components.

In traditional system, an emergency ventilation system is sometimes required in case of AC power failures. This is needed to avoid overheating in the cabinet or accumulation of vented hydrogen from the batteries. Such systems are not needed when all parts are DC powered since they will continue to run on battery in the case of an AC power failure. Thus, the costs of this ventilation system are also avoided.

Since conventional air-conditioners which utilize a vapor cycle system have seals and moving parts, they are not as reliable as passive cooling systems. More frequent maintenance visits are needed, which are significant cost factors. Hundreds or even thousands of such enclosures may be disbursed throughout a given region. Travel time to service the various systems in remote locations is costly, especially with so many enclosures to be visited. By employing only fans and thermo-electric cooling devices, maintenance costs can be significantly reduced.

A further procedure may be utilized to help decrease cooling costs in these enclosures. At nighttime, the typical daily temperature cycle will result in a natural cooling of an outdoor closure and its contents. Further, utility power charges may be lower in the evening since it is during off-peak hours. It is possible to run the cooling system at night so that batteries can be cooled below the nominal operating temperature, such as to 22° C. rather than the nominal 25° C. Due to the thermal mass of the batteries, it will take a number of daylight heating hours to reheat the batteries to a temperature where the cooling system must turn on. During this peak utility cost time of the day the cooling system can remain off until the battery temperature reaches a cooling turn on set point. Battery temperature sensors are thus required which interact with the cooling system control. An additional sensing mechanism is also required. A solar light sensor identifies time of day to ensure that the cooling system runs primarily at night and turns off during the early part of the day to avoid peak utility charges. It would also be possible to use a clock arrangement. The controller could be programmed so that the battery cooling system would run more aggressively during the evening hours and less so during the daytime.

As can be seen, using the hybrid system of the present invention allows the cooling system to optimize the temperature at which the electronics and batteries operate, which can improve performance and extend battery life. Power consumption and resultant utility costs can be reduced. The initial cost of the cooling system may also be reduced. Using DC components allows the cooling of the enclosure even during a power outage. Maintenance costs and visits are reduced by using components without as many moving parts. The result of this is a cooling system which is cheaper to build and operate and which provides increased life for batteries.

The present invention has been described herein in terms of several preferred embodiments. However, modifications and additions to these embodiments will become apparent to those of ordinary skill in the art upon a reading of the foregoing description. It is intended that all such modifications and additions comprise a part of the present invention to the extent that they fall within the scope of the several claims appended hereto.

The invention claimed is:

1. An outdoor electronics enclosure, comprising:
    a housing;
    a divider within said housing, dividing said housing into two compartments, one of said compartments being a battery compartment;
    a door attached to said housing for entry into said housing; and
    a cooling system for said housing, including separate cooling devices for said compartments, said cooling devices being mounted in said door and being of different types, the cooling device for the battery compartment being an air conditioner.

2. The outdoor electronics enclosure of claim 1, wherein another of said compartments houses electronics.

3. The outdoor electronics enclosure of claim 2, wherein said cooling device for the electronics compartment is a direct air cooling device.

4. The outdoor electronics enclosure of claim 3, wherein said direct air cooling device includes at least one fan.

5. The outdoor electronics enclosure of claim 3, wherein said direct air cooling device includes a filter.

6. The outdoor electronics enclosure of claim 2, wherein said cooling device for the electronics compartment is a heat exchanger.

7. The outdoor electronics enclosure of claim 1, wherein said air conditioner is a thermoelectric type air conditioner.

8. The outdoor electronics enclosure of claim 1, wherein said cooling devices are powered by direct current.

9. A hybrid cooling system for an enclosure having a plurality of compartments including a battery compartment, comprising:
    a plurality of separate cooling devices having no shared components;
    each of said plurality of cooling devices providing cooling to a single compartment; and
    each of said cooling devices being mounted in a door to said enclosure and being of a different type, the cooling device for said battery compartment being an air conditioner.

10. The hybrid cooling system of claim 9, wherein one of said plurality of cooling devices is a direct air cooling device.

11. The hybrid cooling system of claim 9, wherein one of said plurality of cooling devices is a heat exchanger.

12. The hybrid cooling system of claim 9, wherein said air conditioner is a thermo-electric type air conditioner.

13. A hybrid cooling system for an enclosure having a plurality of compartments including a battery compartment, comprising:
    a plurality of separate cooling devices having no shared components, said plurality of cooling devices being powered by direct current;
    each of said plurality of cooling devices providing cooling to a single compartment; and
    each of said cooling devices being of a different type, the cooling device for said battery compartment being an air conditioner.

14. The hybrid cooling system of claim 13, wherein said air conditioner is a thermoelectric type air conditioner.

15. The hybrid cooling system of claim 13, wherein another of said compartments houses electronics, and wherein said cooling device for the electronics compartment is a direct air cooling device.

16. The hybrid cooling system of claim 15, wherein said direct air cooling device includes at least one fan and a filter.

17. The hybrid cooling system of claim 13, wherein another of said compartments houses electronics, and wherein said cooling device for the electronics compartment is a heat exchanger.

18. The hybrid cooling system of claim 9, wherein each of said plurality of cooling device cools the corresponding compartment to an optimal temperature for contents of the compartment, regardless of the temperature of other compartments.

* * * * *